United States Patent [19]
Lukins, Jr.

[11] Patent Number: 5,900,104
[45] Date of Patent: May 4, 1999

[54] PLASMA SYSTEM FOR ENHANCING THE SURFACE OF A MATERIAL

[75] Inventor: Ronald E. Lukins, Jr., Whittier, Calif.

[73] Assignee: Boeing North American, Inc., Seal Beach, Calif.

[21] Appl. No.: 08/658,189

[22] Filed: Jun. 4, 1996

[51] Int. Cl.$^6$ .............................. C23F 1/02; C23C 14/00
[52] U.S. Cl. .............................. 156/345 P; 156/345 MG; 204/298.37
[58] Field of Search ....................... 156/345 P, 345 MG, 156/345 Y; 204/298.37

[56] References Cited

U.S. PATENT DOCUMENTS

| | | | |
|---|---|---|---|
| 3,462,335 | 8/1969 | Hansen et al. | 156/272 |
| 4,588,641 | 5/1986 | Haque et al. | 428/413 |
| 4,765,860 | 8/1988 | Ueno et al. | 156/272.6 |
| 5,236,512 | 8/1993 | Rogers et al. | 134/1 |
| 5,290,382 | 3/1994 | Zarowin et al. | 156/345 |

*Primary Examiner*—Gary Geist
*Assistant Examiner*—Jafar Parsa
*Attorney, Agent, or Firm*—Lawrence N. Ginsberg

[57] ABSTRACT

A housing is provided which is positionable adjacent a surface of a material to be treated. The housing and the surface of the material cooperate to form a reaction chamber. An exposure environment is provided having a plurality of components within the reaction chamber. A first component comprises charged particles. A second component comprises chemically active neutral particles. A third component comprises electromagnetic radiation. When the housing is so positioned adjacent a surface and the desired exposure environment is provided, the surface is altered as desired for cleaning, material removal or as preparation for adhesive bonding or etching.

13 Claims, 6 Drawing Sheets

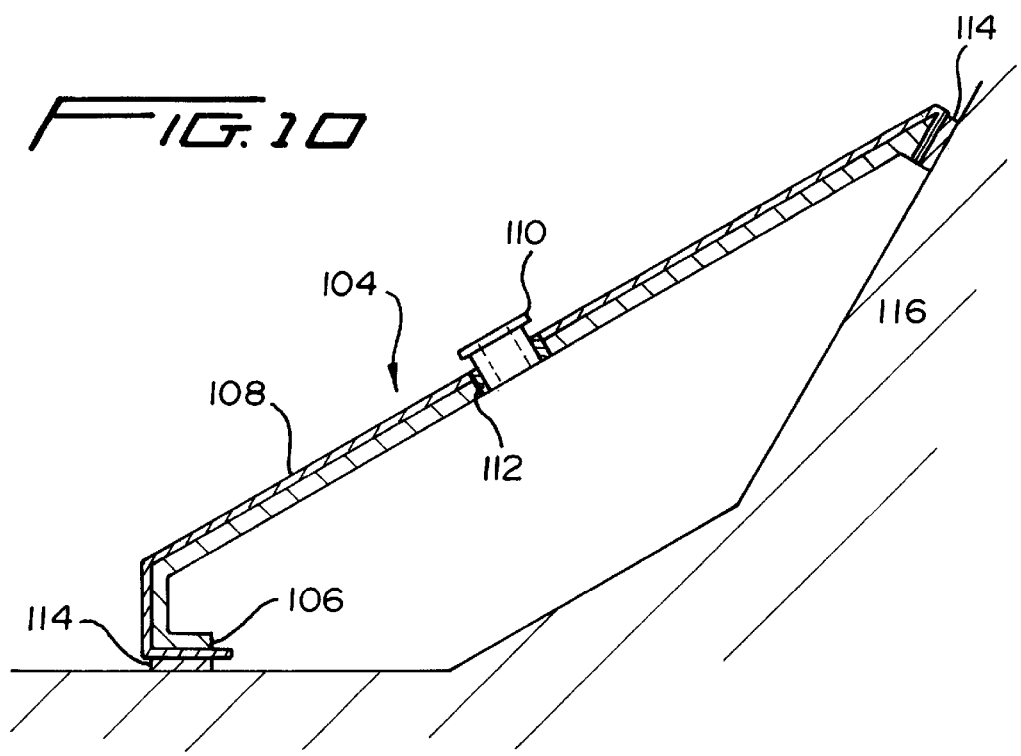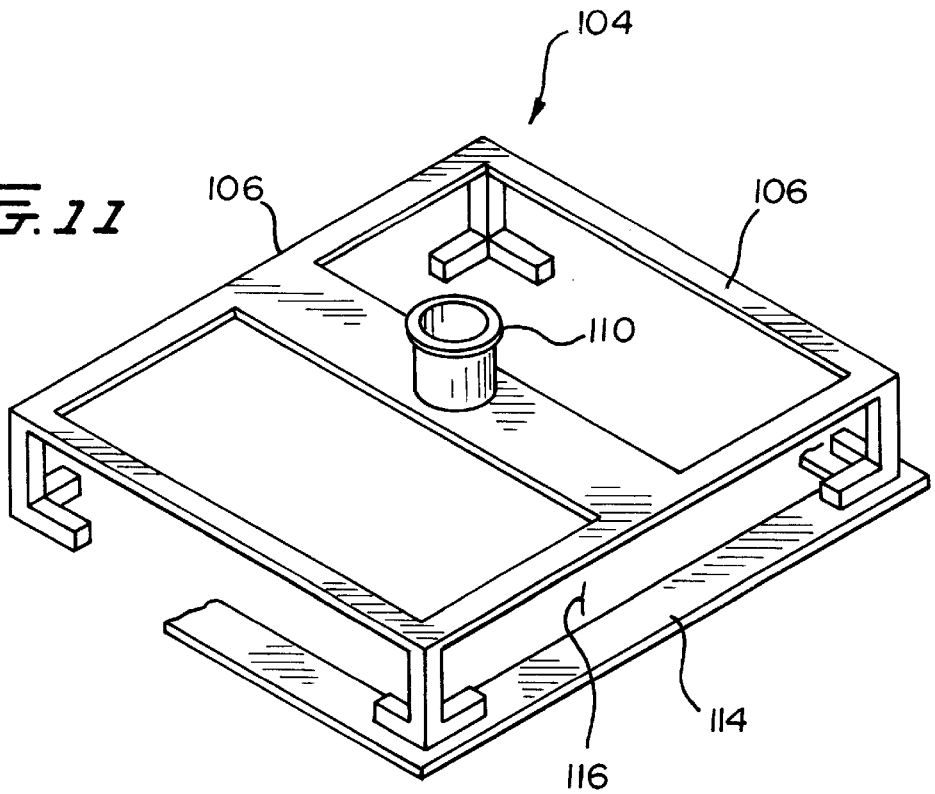

PLASMA SYSTEM FOR ENHANCING THE SURFACE OF A MATERIAL

BACKGROUND OF THE INVENTION

1. Field of the Invention

The present invention relates to enhancing the surface of a material for cleaning, material removal for the preparation of adhesive bonding or etching, and more particularly, to the generation and use of neutral, chemically active particles to chemically react with a material surface, so as to alter the surface as desired for the cleaning, material removal or preparation for adhesive bonding or etching.

2. Description of the Related Art

Large scale low-temperature plasma related methods and devices are needed for surface cleaning and pre-conditioning materials, for both laboratory, manufacturing, and field applications. One of the problems encountered in developing such procedures and devices is scaling up specific processing environments, which produces desired material effects on a small scale, such that large scale exposure can be effectively performed. The coupling of system parameters is strong for low-temperature plasma systems. This coupling makes scaleup difficult since both substrate temperatures and reactive species need to be controlled or altered, and since the coupling of operating parameters which influence reactivity and temperatures severely restrict the degree of such controllability. There are no process models or experimental database, or other knowledge database which permit scaleup system design.

Systems are needed for plasma processing a broad scope of materials for field and manufacturing applications. Critical to cost effectiveness is flexibility in design for the purpose of varying plasma generated environments over materials to be processed.

U.S. Pat. No. 4,588,641, issued to Haque et al., discloses a 3-step plasma treatment for improving a laminate adhesion of metallic and non-metallic substrates. The treatment comprises sequentially exposing the substrate to a first plasma of oxygen gas, a second plasma of a hydrocarbon monomer gas and a third plasma of oxygen gas. The process has particular utility in forming polymeric films on one or more surfaces of copper or copper alloy foils to be used in printed circuit applications.

U.S. Pat. No. 3,462,335, issued to R. H. Hansen et al., discloses subjecting hydrocarbon, fluorocarbon and polyamide polymers to a stream of excited inert gas.

U.S. Pat. No. 4,765,860, issued to S. Ueno et al., discloses a method for the preparation of a flexible base for printed circuit board of the type formed of lamination of a flexible sheet-like polymeric base and a metal, e.g. copper, foil adhesively bonded thereof by use of an adhesive, in which the surface of the polymeric base prior to bonding of the metal foil is subjected to exposure to low temperature plasma so that the adhesive bonding strength between the polymeric base and the metal foil can be improved.

None of the above described references discusses plasma processing systems for cost effective and flexible design field and manufacturing applications which vary plasma generated environments over a variety of materials to be processed.

SUMMARY OF THE INVENTION

The present invention is a system for enhancing the surface of a material for cleaning, material removal or preparation for adhesive bonding or etching. In its broad aspects, it comprises a housing positionable adjacent a surface of a material to be treated. The housing and the surface of the material cooperate to form a reaction chamber. Means are associated with the housing for providing an exposure environment having a plurality of components within the reaction chamber. A first component comprises charged particles. A second component comprises chemically active neutral particles. A third component comprises electromagnetic radiation. When the housing is so positioned adjacent to a surface and the desired exposure environment is provided, the surface is altered as desired for cleaning, material removal or as preparation for adhesive bonding or etching.

Since the surface of the material to be treated and the housing cooperate to form a reaction chamber, plasma processing in the field is efficiently performed.

BRIEF DESCRIPTION OF THE DRAWINGS

FIG. 10 is a schematic illustration of an embodiment, which involves field use of film electrodes for arbitrary shaped surfaces.

FIG. 11 is a top perspective view of the FIG. 10 embodiment with the film electrodes shown removed for the purposes of clarity.

DETAILED DESCRIPTION OF THE PREFERRED EMBODIMENT

Figure 1:
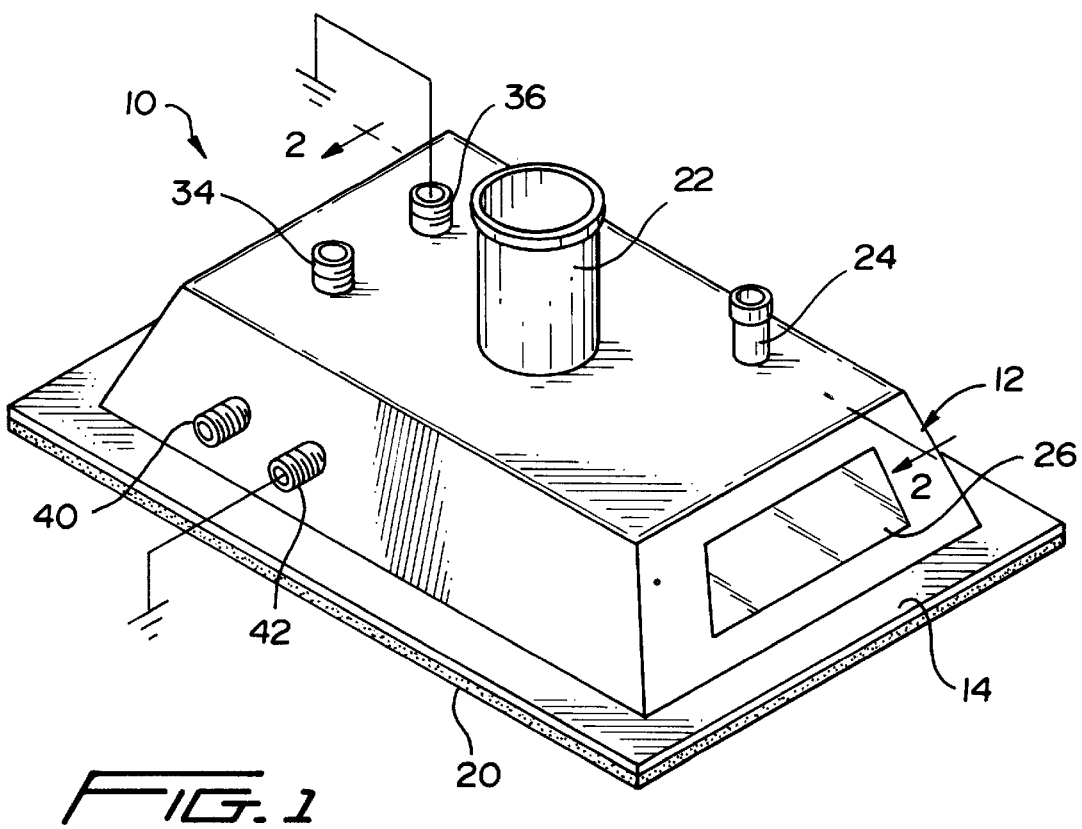
FIG. 1 is a perspective view of a first embodiment of the system of the present invention.
Figure 2:
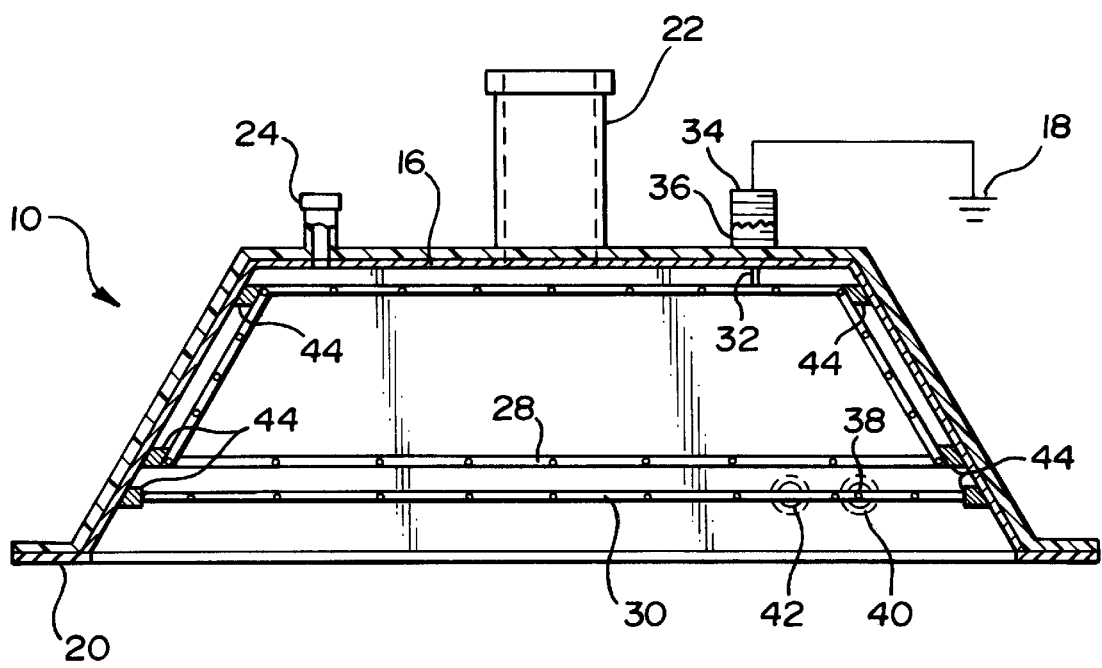
FIG. 2 is a cross-sectional view of the system of FIG. 1, taken along line 2—2 of FIG. 1.

Referring now to the drawings and the characters of reference marked thereon, FIGS. 1–4 illustrate a preferred first embodiment of the system of the present invention, designated generally as 10. A housing 12 includes a flanged periphery 14. The housing may be formed of fiberglass, composite, or other structural materials, which may maintain sufficient rigidity to provide a reaction chamber with a vacuum therein. A Faraday shield 16 is embedded within the fiberglass layers for isolating the outside environment from electromagnetic fields generated within the system 10. The Faraday shield 16 is grounded to the power supply, as will be explained in more detail below, as shown by numeral designation 18 in FIG. 2.

A vacuum seal material 20 is provided along the flanged periphery 14 for providing a vacuum seal between housing 12 and the material to be tested, as will be described below in more detail. The vacuum seal material may comprise RTV rubber, which is bonded to the flange 14 by RTV adhesive. Use of this material has been found to provide an effective means for providing a rough vacuum seal without the need for vacuum grease or other sealing lubricants. A quick connect vacuum port 22 is provided. A quick connect parent gas inlet port 24 is also provided.

Although only a single parent gas inlet port 24 and vacuum port 22 have been shown, it is understood that a plurality of such ports may be utilized to ensure good parent gas mixing within the housing at all times. A viewing window 26 is preferably provided for visual observation or diagnostic monitoring.

Figure 4:
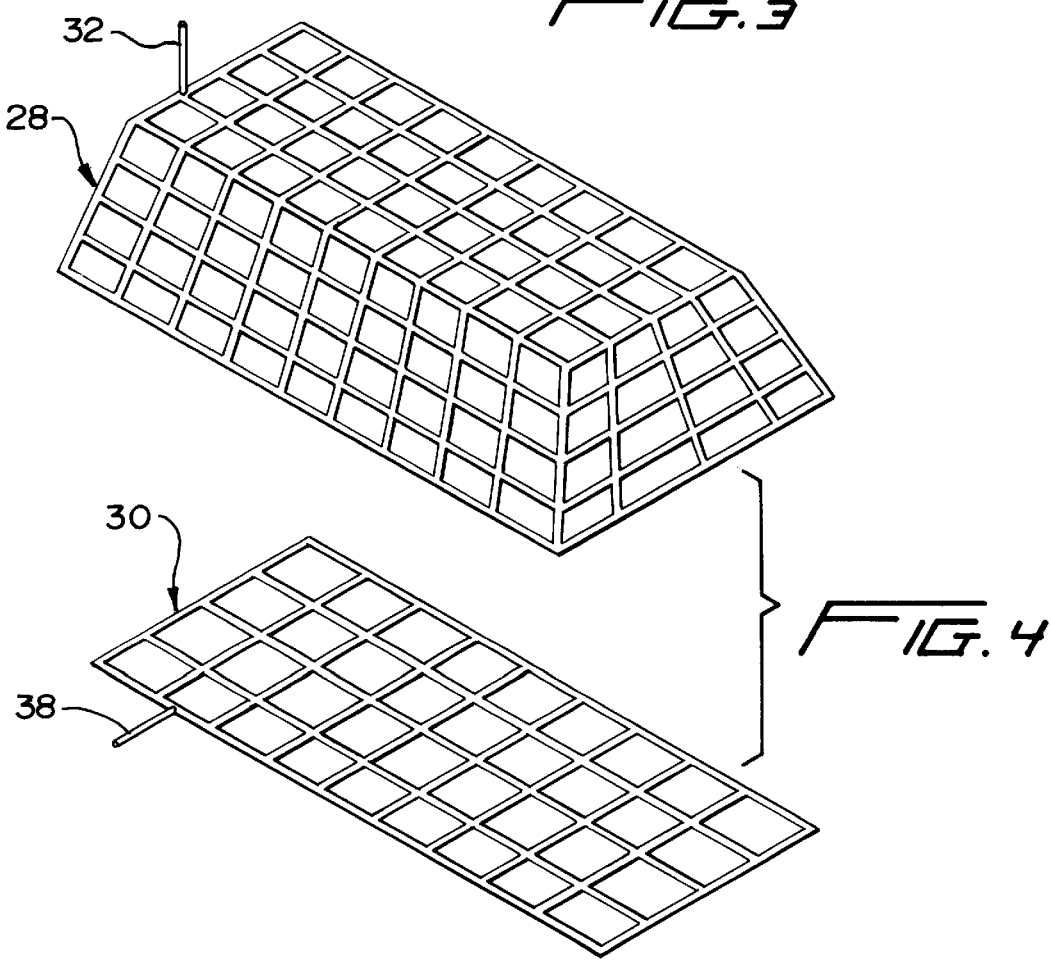
FIG. 4 is a perspective view of the electrodes of the first embodiment.

Referring now to FIG. 4, a first electrode 28 and a second electrode 30 are illustrated. Electrode 28 comprises a wire mesh material having a shape conforming to the housing 12. The second electrode 30 comprises a wire mesh panel suspended within the housing 12. Electrode 28 includes a lead 32, which connects to an electrical connector 34 for a power supply. Lead 38 from the second electrode 30 is connected to a respective power input connector 40. A ground connector 36 is connected to the Faraday shield 16. A ground connection is made between a ground connector 42 and the Faraday shield 16.

The electrode 28 and electrode 30 are shaped as shown to provide uniform acceleration of charged particles generated in the chamber closest to electrode 28, accelerated through wire mesh 30 and onto the material surface to be processed with controlled direction and velocity. It is understood that other electrode shapes may be used depending on the desired application. For example, vertically spaced cylindrical electrodes would provide a circular distribution of charged particles.

Instead of wire mesh, other materials may be used for the electrodes. For example, structural steel embedded in RCG-coated tile material may be used for high temperature applications. Ceramic materials may alternately be used for high temperature applications. For lower temperature applications, i.e. below the melting point of glass, quartz or borosilicate glass formed over electrodes of desired shapes may be utilized.

Figure 3:
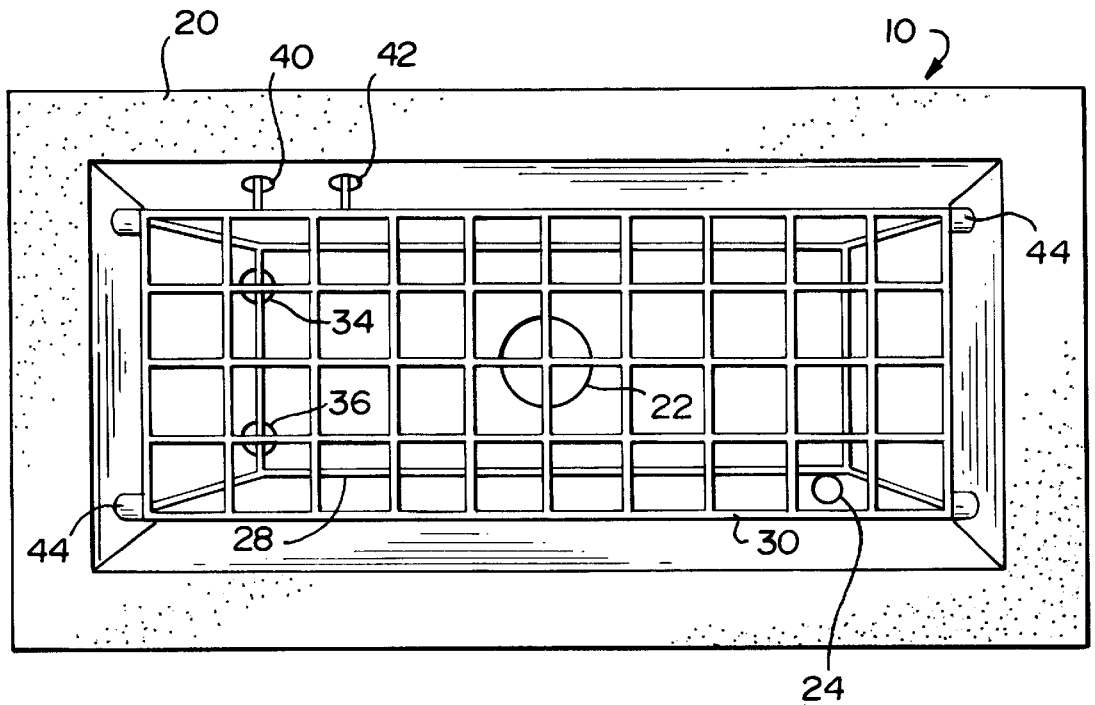
FIG. 3 is a bottom view of the embodiment of FIG. 1.

The electrodes 28, 30 are mounted to the housing by mounts 44 (FIG. 3). Mounts 44 are preferably formed of fiberglass. Obviously, other materials may be used which are non-conductive, have low thermal conductivity, and are capable of high temperature stability.

Figure 5:
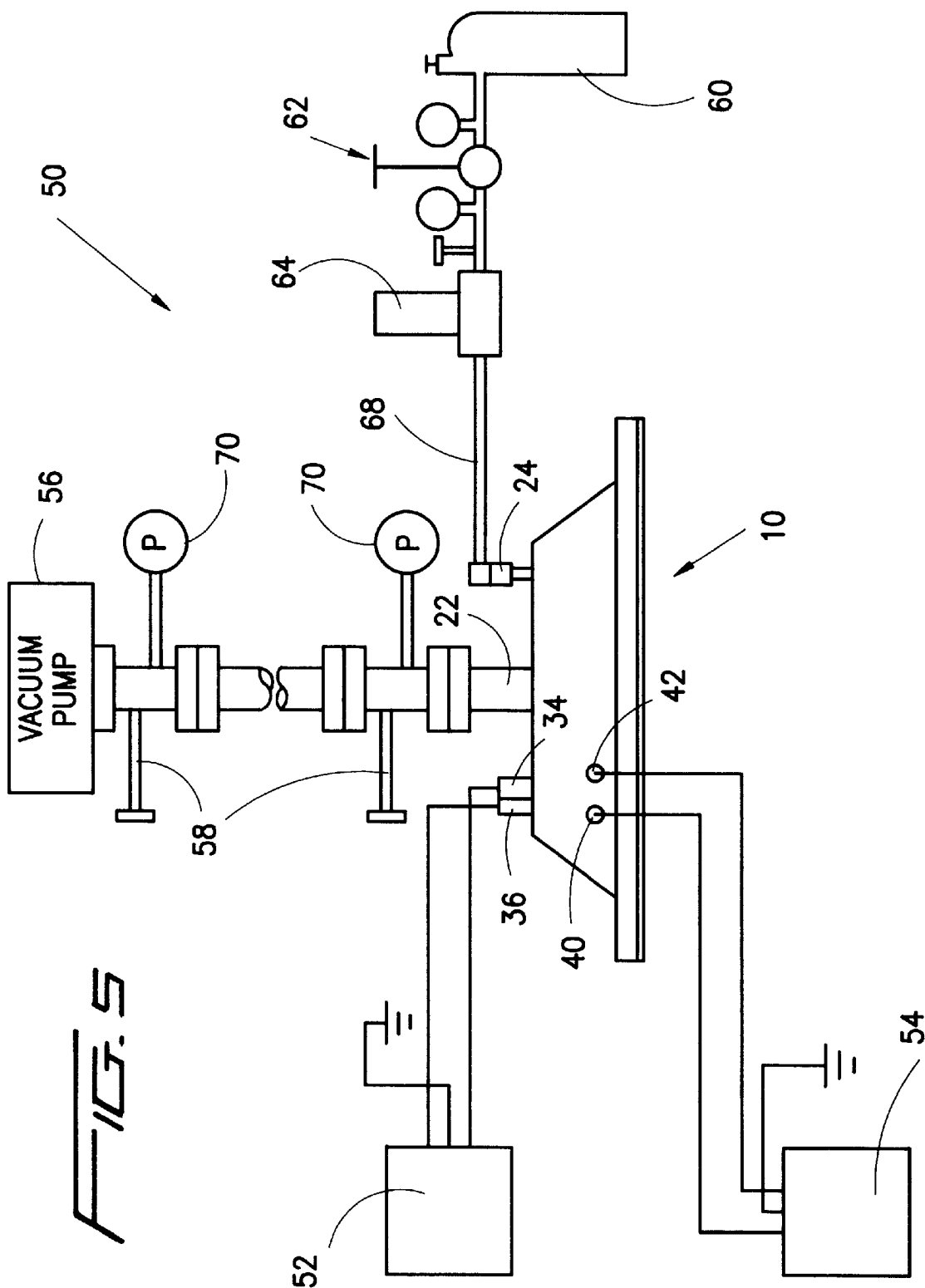
FIG. 5 is a schematic illustration of the overall system of the present invention, which utilizes the system of FIGS. 1–4.

Referring now to FIG. 5, the overall system of the present invention is illustrated, designated generally as 50. Grounded connector 36 and connector 34 are connected to a first power system 52. Power system 52 preferably comprises an RF power source. This RF power source 52 comprises a generator and impedance matching network such that the matching network is designed for use of the specific electrode configuration. The matching network can be tunable or selectively designed for specific power generation.

Connector 40 and grounded connector 42 are connected to a second power system 54. Power system 54 preferably comprises a pulsed voltage source. With this RF power source/pulsed voltage power source, the charged particles created by the power system 52 are accelerated through the electrode mesh 30 and onto the material to be processed. Electrode 30 can also be driven by power system 52 by electrical connections from power system 52 through voltage current and phase manipulating electronics to connectors 40, 42.

The frequencies of either of the power systems can be altered in order to manipulate charged particle distribution at the material surface to be processed.

A vacuum pump 56 is used and should be of a type that is oxygen compatible. One or more flow restriction valves 58 may be used. The pump of 56 should operate in a "rough" pressure range of about 0.01–10 torr. The vacuum pump 56 may have a sieve filtering system and may include a separate inlet feed for nitrogen gas.

Parent gas inlet 24 is preferably connected to a parent gas supply source 60 through a regulator flow valve 62 and flow meter/controller 64. A preferred parent gas is oxygen. Other parent gases may include diatomic gases. Still other gases may be utilized that have neutral, chemically active species.

Figure 6:
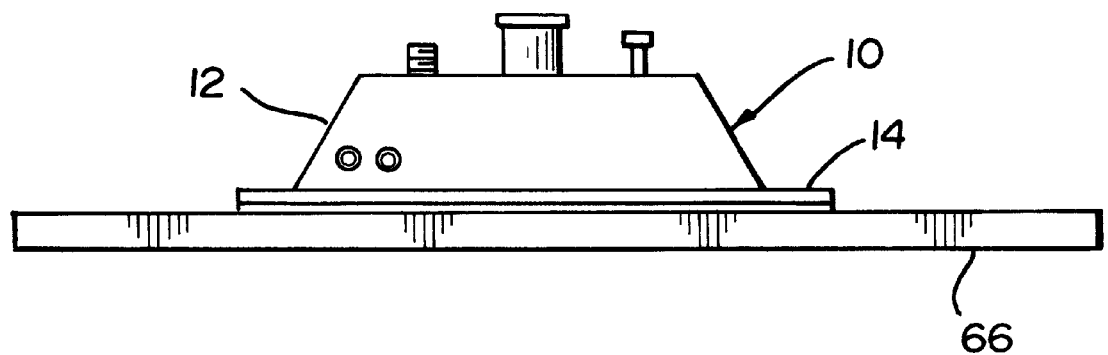
FIG. 6 is a schematic illustration of the first method of operation in which the material to be processed forms a complete side of the reaction chamber.

During operation, the housing 12 is placed over the region to be processed. As shown in FIG. 6, in a first method of operation, the material 66 to be processed forms a complete side of the reaction chamber. In other words, the material to be processed is wider than the flanged periphery 14 of the housing 12. While holding the housing 12 in place, the vacuum pump 56 (see FIG. 5) is connected to the connector 22 preferably using a quick connector fitting. The valves 58 may be manual or automated and permit evacuation of the chamber as desired. The vacuum, at this point, is in the closed position. The parent gas inlet line 68 is attached, leaving the flow off. The chamber is then evacuated. The material 66 to be processed should be of sufficient mechanical strength so that there is no bowing or bending thereof during such a vacuum pull. Pressure gauges 70 and valves 58 are utilized to provide the desired pressure. The power supplies 52, 54 are then connected. The parent gas flow and vacuum values are adjusted to attain the desired pressure. A trigger pulse is used if needed to initiate discharge. The power supplies 52, 54 are set to the desired electrical parameters. Plasma diagnostics may be used to depict end points for processing. Radiation sources (not shown) may be included as part of the housing design to enhance the reactivity of the material to be processed. If such sources are included, their respective power leads can now be connected and power supplies adjusted. Such radiation sources may include, for example, arc lamps, resonant line emission lamps, laser sources, and other ultraviolet radiation producing sources.

During processing, there is a combination of system parameters for providing an exposure environment having a plurality of components within the reaction chamber. The first component comprises charged particles. These charged particles, with specific desired properties are generated as a result of energy delivered from the power supplies, and subsequent interaction of electro-magnetic energy with the parent gases which are introduced into the chamber. A second component within the reaction chamber comprises chemically active neutral particles. These chemically active neutral particles are generated by dissociative impact of the charged particles with the parent gas or other neutral species. A third component comprises electromagnetic radiation. This radiation is generated by powering the electrodes, from emissions from the plasma species, and radiation introduced by independent means, such as mentioned above.

Prediction of charged particle distributions at the surface of the material to be processed are commonly, although frequently analytically complicated, made with the use of kinetic theory. Charged particle spatial and velocity (phase space) distribution functions are predictable through solving sets of coupled equations of the following types: Boltzrian equations, Maxwell's equations, equations of state, and fluid model equations.

Both chemically reactive and unreactive neutral particle distributions at the surface of the material to be processed are also determined through the use of kinetic theory. The particle flux for the ith species is given by:

$$v_i = A p_i \{(mw)_i T\}^{1/2}$$

where $$v = \frac{\text{no. of atoms}}{\text{cm}^2 \cdot \text{sec}}, \text{ particle flux of } i^{th} \text{ species}$$

A=constant depending on units $p_i$, $(mw)_i$=partial pressure and molecular weight of the $i^{th}$ neutral species T=gas temperature After processing, the electrical power, vacuum port valves and parent gas flow can be sequentially turned off. A housing up-to-air valve (not shown) can be opened and the housing 12 removed from the material. The housing 12 may be portable so that field use of the system may be provided.

Typically, the first power system 52 may involve use of a 13.56 mHz power generator/impedance matching network system for use up to 300 watts. Parent gas feed rates typically fall within the range of 1 to 100 standard cubic centimeters per second (sccm). The valves external to the housing are adjusted for typical operation between 0.05 torr to 50 torr. As noted above, when in operation, the top electrode, i.e. electrode 28, operates in a manner which creates charged particles. Depending on the precise operating parameters, the charged particle species positions are controllably located at prescribed distances from the surface to be processed. The lower electrode 30 can be pulsed at various frequencies and with various pulse shapes and magnitudes so as to accelerate charges particles in the manner so that they impinge on the surface and controllably react with the surface to be processed. The effect of varying pulse frequency and pulse shape on charged particle impact parameters is predictable through kinetic theory as described by the previous theoretical discussion of charged particle distribution.

The system 10 may be used for composite preconditioning prior to adhesive bonding, cleaning metal and other surfaces with environmentally friendly bi-products, for plastic and other material surface roughening and activation. The roughening can be used to make surfaces optically diffuse, increase the surface area for bonding and for chemically activating the material surface for subsequent reaction.

Figure 7:
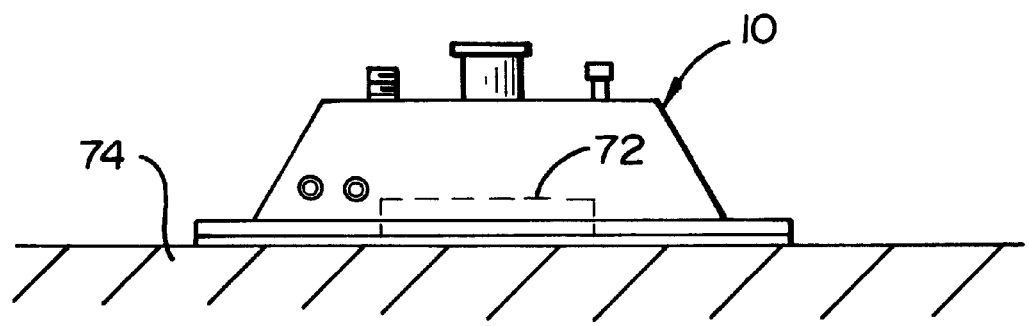
FIG. 7 is a second method of operation, in which the material to be processed is processed entirely within the reaction chamber.

Referring now to FIG. 7, in an alternate method of operation, the material 72 to be processed is processed entirely within the reaction chamber. In this instance, the specimen 72 and system 10 rest on a rigid surface 74.

It is understood that the housing dimensions can be made to suit differing applications. For example, a long housing may be utilized for long I-beams. The parent gas inlets and vacuum ports should be located in a manner such that the pressure within the entire housing is uniform. The chemically active neutral particles created within the discharge region spatially separated from the material are uniformly impinged on the material to be processed.

Various charge particle control techniques may be utilized. For example, dark spaces can be formed within the housing and over the material to be processed under desired operating parameters, electrode shapes and positions. Preferential conditioning locations may be desired for many applications. In particular, the reactivity over dark zones (containing ions) can be substantially different than glow zones. Deep impressions can be made on specified periodic material regions while leaving the areas in-between lightly conditioned.

Figure 8:
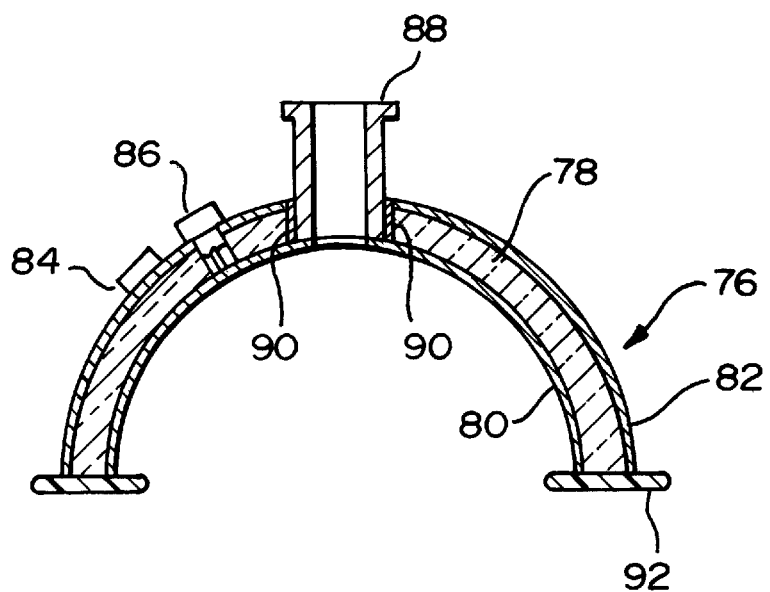
FIG. 8 is a schematic illustration of a second embodiment in which film electrodes are used for ease of construction.

Referring now to FIG. 8, a second embodiment is illustrated, designated generally as 76 in which a hemispherical glass housing 78 supports film electrodes 80, 82. Film electrode 80 is formed on the inner glass surface by, for example, vacuum deposition techniques. Typical conductive substances such as aluminum may be used with, for example, a silicon based coating deposited over the film. The metalized film provides an inexpensive electrode for providing the desired charged particles. The silicon-based coating provides protection from the oxygen plasma environment. It is understood that as the parent gas species is changed, the housing and electrode materials are changed to accommodate materials compatibility issues. Electrode 82 comprising a metalized film, similar to electrode 80, serves as a Faraday shield. Suitable connectors 84, 86 are provided for the electrodes 82, 80, respectively.

A vacuum flange 88 is bonded to the housing 78 with a silicon based adhesive 90. An RTV/silicon foot vacuum seal 92 provides a vacuum seal between the housing 78 and the substrate to be processed (not shown). The embodiment of FIG. 8 has a primary advantage in being simple to manufacture.

Figure 9:
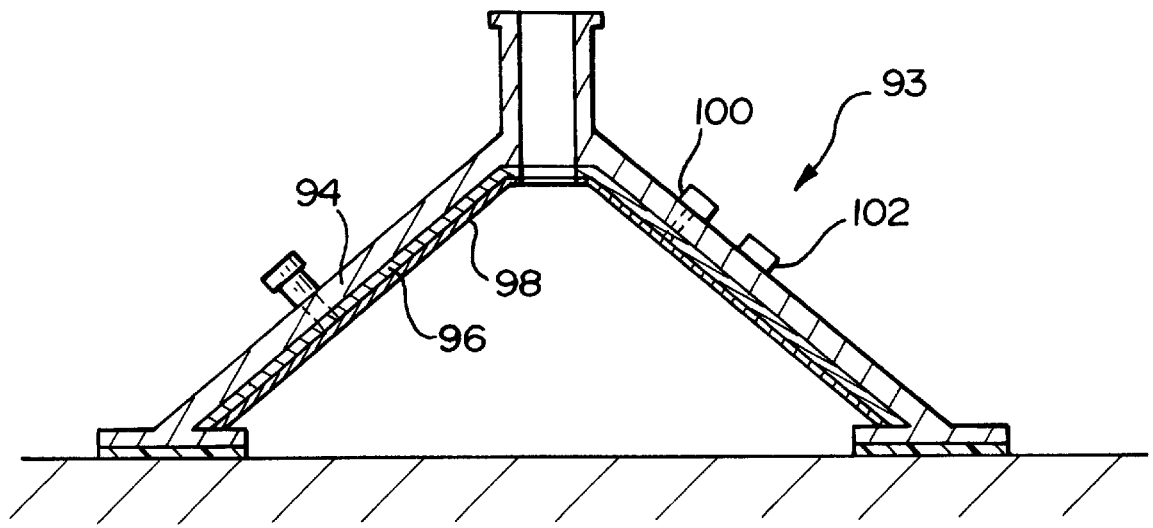
FIG. 9 is a schematic illustration of a third embodiment in which the housing is of unitary construction.

Referring now to FIG. 9, a schematic illustration of a third embodiment is shown, designated generally as 93, in which a housing 94 is of unitary construction, including vacuum flange. The preferred material for the housing is metal. A non-conductive insulation material 96, such as fiberglass, is bonded to the housing 94. Material 96 is coated with a metal film 98, which serves as an electrode. A silicon-based coating is provided on the surface of coating 98 to provide protection of the electrode from the plasma.

A "hot" electrical connector 100 is in electrical contact with the electrode 98. A ground electrical connector 102 is connected to the housing 94.

The embodiment illustrated in FIG. 9, like the FIG. 8 embodiment, is a relatively inexpensive system, however, it is perhaps more rugged than the FIG. 8 embodiment because of the added strength of the metal housing 94.

FIG. 10 is a schematic illustration of an embodiment, which involves field use of film electrodes for arbitrary shaped surfaces, this embodiment being designated generally as 104. A non-conductive frame or housing 106 provides rigid mechanical support for metalized film electrode 108. A vacuum flange 110 is provided and sealed with a zinc oxide seal 112. Zinc oxide seals 114 seal the apparatus 104 relative to a substrate 116. The embodiment of FIG. 10 has a primary advantage of being flexible in design to enable a variety of shapes to be enveloped by a housing for one-of-a-kind substrate processing.

Referring to FIGS. 8–10, it is understood that, although not shown, a second electrode 30 as in FIG. 4, may be used for acceleration of charged particles depending upon specific applications. Use of a 3-sided housing, as a specific application of the FIG. 10 embodiment, permits conditioning of more than one side of the material to be processed. The electrodes should be configured along the housing as appropriate.

Referring now to FIG. 11, a top perspective view of the embodiment 104 is illustrated with the metalized film electrode 108 removed for the purposes of more clearly showing the frame or housing 106. This embodiment is particularly adaptable for use for substrates having irregular shapes because the film electrodes permit large area plasma production.

EXAMPLE 1

Using a system described with respect to FIGS. 1–5, a housing was utilized with an exposure area of approximately 200 sq. inches. A granite table served as a substrate with a mold release agent over its surface. The mold release agent used was Stephan Miller SM 143. The mold release agent was provided as a film having a thickness of 5 mils.

The chamber vacuum pressure was set at 0.4 torr. The oxygen gas feed rate was set at 20 sccm. The power was supplied to a single electrode (the top electrode) at 13.56 MHz and 50 watts. (A bottom electrode was not used.) The electrode used was formed of a wire mesh. In a time period of just under 20 minutes, all of the film was removed.

EXAMPLE 2

Using the same system, a steel substrate was provided with a 10 mil. thick hydrocarbon oil film. The chamber vacuum pressure was set at 0.1 torr. The oxygen gas feed rate was set at 15 sccm. The power was supplied at 13.56 MHz and 60 watts.

Within 1 hour the entire film was removed.

Obviously, many modifications and variations of the present invention are possible in light of the above teachings. It is therefore to be understood that, within the scope of the appended claims, the invention may be practiced otherwise than as specifically described. What is claimed and desired to be secured by Letters Patent of the United States is:

1. A system for enhancing the surface of a material for cleaning, material removel or preparation for adhesive bonding or etchng, comprising:
   a) a housing positionable adjacent a surface of a material to be treated, said housing and the surface cooperating to form a reaction chamber;
   b) means associated with said housing for providing an exposure environment having a plurality of components with said reaction chamber, said means associated with said housing comprising film electrode means, said plurality of components, comprising:
   i) a first component comprising charged particles;
   ii) a second component comprising chemically active neutral prices; and,
   iii) a third component comprising electromagnetic radiation, wherein when said housing is so positioned adjacent the surface and the desired exposure environment is provided, the surface is altered as desired for cleaning, material removal or as preparation for adhesive bonding or etching wherein said film electrode means supported along non-conductive surface of said housing.

2. The system of claim 1, wherein said housing is of sufficient portability to be hand-held.

3. The system of claim 2, wherein said housing farther comprises a flanged periphery including sealing means for providing a vacuum seal between said housing and the material to be treated.

4. The system of claim 3, wherein said housing further comprises an electrically grounded Faraday shield for isolating the outside environment from electromagnetic fields generated within said system.

5. The system of claim 2, wherein said housing comprises a parent gas inlet for introducing parent gas into said reaction chamber and means for providing a vacuum within said reaction chamber.

6. The system of claim 1, wherein said means associated with said housing for providing an exposure environment, comprises:
   a) electrode means for generating said charged particles; and
   b) a power source means connected to said electrode means for providing power to said electrode means.

7. The system of claim 6, wherein said means associated with said housing for providing an exposure environment further comprises a valve attached to a vacuum pump, said vacuum pump for providing a vacuum within said reaction chamber, said valve for adjusting the vacuum pressure for controlling said exposure environment.

8. The system of claim 1, wherein said means associated with said housing for providing an exposure environment, comprises spaced electrode means for generating said charged particles, said spaced electrode means comprising:
   at least one spaced electrode for generating said charged particles, which are directed at predetermined locations on said surface.

9. The system of claim 8, wherein said at least one spaced electrode comprises a plurality of spaced electrodes.

10. The system of claim 9, wherein said plurality of spaced electrodes comprises:
    a first spaced electrode, which is connected to a first power source, said first spaced electrode having a shape for providing a predetermined charged particle distribution on said surface.

11. The system of claim 10, wherein said plurality of spaced electrodes comprises:
    at lease one second spaced electrode, which is connected to at least a second power source, said second spaced electrode cooperating with said first spaced electrode for enhancing said charged particle distribution on said surface.

12. The system of claim 1, wherein said film electrode means comprises:
    a film electrode.

13. The system of claim 12, wherein said film electrode is formed on an inner surface of said housing.

* * * * *